United States Patent [19]
Zhang et al.

[11] Patent Number: 5,485,031
[45] Date of Patent: Jan. 16, 1996

[54] ANTIFUSE STRUCTURE SUITABLE FOR VLSI APPLICATION

[75] Inventors: Guobiao Zhang, Elcerrito; Chenming Hu, Alamo; Steve S. Chiang, Saratoga, all of Calif.

[73] Assignee: Actel Corporation, Sunnyvale, Calif.

[21] Appl. No.: 156,612

[22] Filed: Nov. 22, 1993

[51] Int. Cl.$^6$ .................................................. H01L 29/00
[52] U.S. Cl. .................. 257/530; 257/50; 257/751; 257/761; 257/763
[58] Field of Search ........................... 257/530, 50, 751, 257/761, 763

[56] References Cited

U.S. PATENT DOCUMENTS

| | | | |
|---|---|---|---|
| 3,675,090 | 7/1972 | Neale | 317/234 |
| 3,787,822 | 1/1974 | Rioult | 340/173 |
| 4,238,839 | 12/1980 | Redfern et al. | 365/96 |
| 4,398,335 | 8/1983 | Lehrer | 29/577 |
| 4,399,372 | 8/1983 | Tanimoto et al. | 307/279 |
| 4,420,820 | 12/1983 | Preedy | 365/105 |
| 4,424,578 | 1/1984 | Miyamoto | 365/104 |
| 4,445,134 | 4/1984 | Miller | 23/48 |
| 4,455,495 | 6/1984 | Masuhara et al. | 307/44 |
| 4,488,262 | 12/1984 | Basire et al. | 365/104 |
| 4,499,557 | 2/1985 | Homberg et al. | 365/163 |
| 4,507,756 | 3/1985 | McElroy | 365/104 |

(List continued on next page.)

FOREIGN PATENT DOCUMENTS

| | | | |
|---|---|---|---|
| 0455424 | 11/1991 | European Pat. Off. | 257/530 |

OTHER PUBLICATIONS

F. A. Cotton et al. *Advanced Inorganic Chemisty* Inerscience Publisher (1962) pp. 493–495.

Gullette et al, "Laser Personalization of NMOS Digital Technologies", 02 May 1983, pp. 1249–1252, (IEEE Int. Sym. Cir. & Sys.).

Iscoff, "Characterizing Quickturn ASICs: Its Done with Mirrors", 01 Aug. 1990, pp. 68–73, *Semiconductor International*.

Chiang et al., "Antifuse Structure Comparison for Field Programmable Gate Arrays", Apr., 1992, pp. 24.6.1–24.6.4, *IEDM92*.

Hamdy et al., "Dielectric Based Antifuse for Logic and Memory ICs", 1988, pp. 786–789, *IEDOM 88*.

Hu, "Interconnect Devices for Field Programmable Gate Array", Apr., 1992, pp. 24.1.1–24.1.4, *IEDM92*.

*Primary Examiner*—J. Carroll
*Attorney, Agent, or Firm*—D'Alessandro & Ritchie

[57] ABSTRACT

The present invention relates to a high performance, high reliability antifuse using conductive electrodes. The problem of switch-off of the programmed antifuses is solved by reducing the thermal conductivity of the conductive electrodes. This is achieved by using lower thermal conductivity conductors for the electrodes or by using thinner electrodes to increase thermal resistance. According to a first aspect of the present invention, the problem of switch-off in conductor-to-conductor antifuses is solved by utilizing conductive electrode materials having a relatively lower thermal conductivity than prior art electrode materials. According to a second aspect of the present invention, the problem of switch-off in conductor-to-conductor antifuses is solved by utilizing relatively thin electrodes, thus increasing their thermal resistance. According to a third aspect of the present invention, a relatively thin barrier layer is placed between one or both of the low thermal conductivity electrodes and the antifuse material in order to prevent reaction between the conductive electrodes and the antifuse material or the materials used in manufacturing such as the etch gas. According to a fourth aspect of the present invention low thermal conductivity conductors are used for both electrodes in the conductor-to-conductor antifuse in order to achieve enhanced reliability and freedom from switch-off. According to a fifth aspect of the present invention switch-off is cured in conductor-to-conductor antifuses without compromising low on-state resistance of the antifuse.

4 Claims, 5 Drawing Sheets

U.S. PATENT DOCUMENTS

| | | | |
|---|---|---|---|
| 4,507,757 | 3/1985 | McElroy | 365/104 |
| 4,507,851 | 4/1985 | Joyner et al. | 29/590 |
| 4,565,712 | 1/1986 | Noguchi et al. | 427/53.1 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,599,705 | 6/1986 | Holmberg et al. | 365/163 |
| 4,647,340 | 3/1987 | Sziuk et al. | 156/662 |
| 4,678,889 | 7/1987 | Yamanaka | 219/121 LJ |
| 4,721,868 | 1/1988 | Cornell et al. | 307/465 |
| 4,748,490 | 5/1988 | Hollingsworth | 357/51 |
| 4,786,904 | 11/1988 | Graham, III et al. | 340/825.83 |
| 4,792,835 | 12/1988 | Sacarisen et al. | 357/23.6 |
| 4,796,074 | 1/1989 | Roesner | 357/51 |
| 4,822,753 | 4/1989 | Pintchovski et al. | 437/192 |
| 4,823,181 | 4/1989 | Mohsen et al. | 357/51 |
| 4,839,864 | 6/1989 | Fujishima | 365/200 |
| 4,847,732 | 7/1989 | Stopper et al. | 361/395 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,893,167 | 1/1990 | Boudou et al. | 357/51 |
| 4,897,836 | 1/1990 | Fitzpatrick et al. | 370/112 |
| 4,899,205 | 2/1990 | Hamdy et al. | 357/51 |
| 4,910,418 | 3/1990 | Graham et al. | 307/465 |
| 4,914,055 | 4/1990 | Gordon et al. | 437/192 |
| 4,916,809 | 4/1990 | Boudou et al. | 29/852 |
| 4,924,287 | 5/1990 | Orbach | 357/51 |
| 4,937,475 | 9/1990 | Rhodes et al. | 307/465 |
| 5,070,384 | 12/1991 | McCollum et al. | 257/530 |
| 5,099,149 | 3/1992 | Smith | 307/465 |
| 5,120,679 | 6/1992 | Boardman et al. | 437/195 |
| 5,166,556 | 11/1992 | Hsu et al. | 307/465 |
| 5,191,550 | 3/1993 | Kubota | 365/96 |
| 5,196,724 | 3/1993 | Gordon et al. | 257/530 |
| 5,210,598 | 5/1993 | Nakazaki et al. | 257/530 |
| 5,233,217 | 8/1993 | Dixit et al. | 257/530 |
| 5,248,632 | 9/1993 | Tung et al. | 437/195 |
| 5,298,784 | 3/1994 | Gambino et al. | 257/529 |
| 5,322,812 | 6/1994 | Dixit et al. | 437/60 |
| 5,353,246 | 10/1994 | Tsang et al. | 365/96 |

ANTIFUSE STRUCTURE SUITABLE FOR VLSI APPLICATION

BACKGROUND OF THE INVENTION

1. Field of the Invention

The present invention relates to one-time user programmable conductor-to-conductor antifuses used in user-configurable semiconductor devices. More particularly, this invention relates to a conductor-to-conductor antifuse structure that avoids the phenomenon of switch-off (or "read disturb") in programmed anti fuses.

2. The Prior Art

Antifuses have been extensively used in Field Programmable Gate Arrays (FPGAs) and other user configurable semiconductor devices for a number of years. One prior art antifuse is made of an oxide-nitride-oxide insulating antifuse layer sandwiched between an N+ diffusion layer and a polysilicon ("Poly") layer (N+/ONO/Poly). Devices according to this design are described in detail in U.S. Pat. Nos. 4,823,181 and 4,881,114. For this class of antifuses, contacts have to be made to the N+ diffusion layer and the poly layer from two corresponding conductive metal lines. This consumes a lot of chip area and introduces additional and unwanted capacitance. Furthermore, the large electrical resistivity of even heavily doped silicon makes the on-state resistance of these antifuses relatively high at about 600 ohms.

A more desirable antifuse would be an antifuse sandwiched directly between two conductive electrodes. Amorphous silicon antifuses and dielectric antifuses between two conductive metal lines have been fabricated. This approach provides a relatively low on-state resistance of about 150 ohms for amorphous silicon and about 80 ohms for dielectric antifuses. A number of patents have issued regarding metal-to-metal antifuse structures. Primarily these patents are directed to teaching how to make low on-state resistance antifuses. See, e.g., Gordon et al., U.S. Pat. No. 4,914,055. Others are directed to low off-state leakage current and low defect density antifuses. See, e.g., Gordon et al., U.S. Pat. No. 5,196,724, and Boardman et al., U.S. Pat. No. 5,120,679. Still others are directed to CMOS low temperature compatible processes. See, e.g., U.S. Pat. No. 5,166,556 to Hsu et al. Some of these patents suggest the use of some of the materials discussed herein in different configurations. For example, U.S. Pat. No. 5,196,724 suggests using TiW electrodes with an amorphous silicon antifuse material; U.S. Pat. No. 5,166,556 suggests using Ti electrodes in conjunction with a relatively thick antifuse layer. Similarly, U.S. Pat. No. 4,914,055 suggests using amorphous silicon as the antifuse material and U.S. Pat. No. 5,166,556 suggests using silicon nitride or silicon oxide as the antifuse material.

Despite the variety of materials and structures suggested by the prior art patents in this field, metal-to-metal antifuses have been unable to achieve wide application in VLSI technology. The obstacle that has so far prevented metal-to-metal antifuses from being widely applied to VLSI technology is the "switch-off" or "read disturb" phenomenon described by C. Hu ("Interconnect Devices for Field Programmable Gate Array" 1992 I.E.D.M., pp. 591–594) and S. Chiang et al. ("Antifuse Structure Comparison for Field Programmable Gate Arrays" 1992 I.E.D.M., pp. 611–614). For example, S. Chiang, et al., supra, and U.S. Pat. No. 5,166,556 mention that an Al-based electrode is not reliable in this application due to the concern that electromigration might occur. Accordingly, a method of avoiding the switch-off phenomenon in conjunction with the implementation of conductor-to-conductor antifuses in a VLSI architecture would be highly desirable.

OBJECTS AND ADVANTAGES

It is an object of the present invention to provide a means for eliminating the switch-off phenomenon in conjunction with the implementation of conductor-to-conductor antifuses in a VLSI architecture.

It is a further object of the present invention to provide a conductor-to-conductor antifuse structure having improved on-state and off-state properties over existing antifuse structures.

It is a further object of the present invention to provide a conductor-to-conductor antifuse structure having a low off-state leakage current.

Yet a further object of the present invention is to provide a conductor-to-conductor antifuse structure having low on-state resistance.

These and many other objects and advantages of the present invention will become apparent to those of ordinary skill in the art from a consideration of the drawings and ensuing description of the invention.

BRIEF DESCRIPTION OF THE INVENTION

The present invention relates to a high performance, high reliability antifuse using conductive electrodes. The problem of switch-off of the programmed antifuses is solved by reducing the thermal conductance of the conductive electrodes. This is achieved by using lower thermal conductivity conductors for the electrodes or by using thinner electrodes to increase thermal resistance According to a first aspect of the present invention, the problem of switch-off in conductor-to-conductor antifuses is solved by utilizing conductive electrode materials having a relatively lower thermal conductivity than prior art electrode materials.

According to a second aspect of the present invention, the problem of switch-off in conductor-to-conductor antifuses is solved by utilizing relatively thin electrodes, thus increasing their thermal resistance.

According to a third aspect of the present invention, a relatively thin barrier layer is placed between one or both of the low thermal conductivity electrodes and the antifuse material in order to prevent reaction between the conductive electrodes and the antifuse material or the materials used in manufacturing such as the etch gas.

According to a fourth aspect of the present invention low thermal conductivity conductors are used for both electrodes in the conductor-to-conductor antifuse in order to achieve enhanced reliability and freedom from switch-off.

According to a fifth aspect of the present invention switch-off is cured in conductor-to-conductor antifuses without compromising low on-state resistance of the antifuse.

DESCRIPTION OF THE PREFERRED EMBODIMENTS

Figure 1:
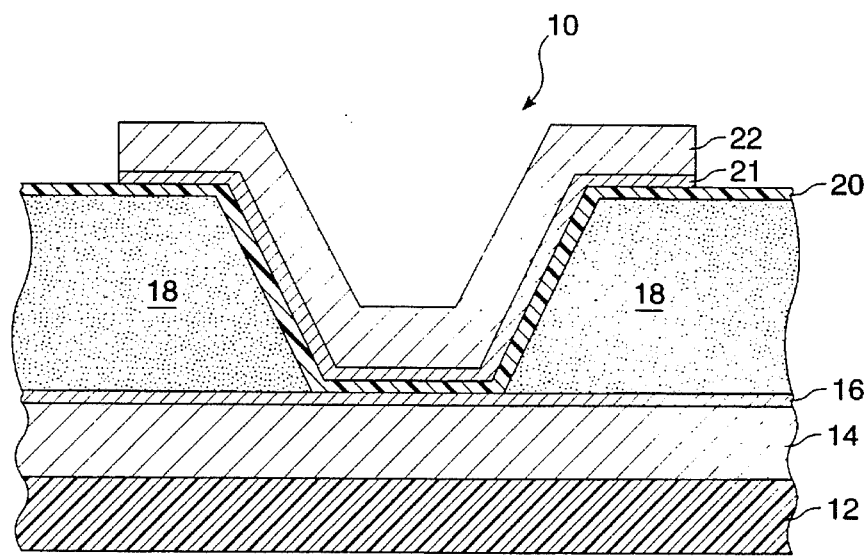
FIG. 1 is a drawing of a first preferred embodiment of the antifuse of the present invention.

Those of ordinary skill in the art will realize that the following description of the present invention is illustrative only and is not intended to be in any way limiting. Other embodiments of the invention will readily suggest themselves to such skilled persons from an examination of the within disclosure.

The present invention is applicable to antifuses comprising an insulating antifuse layer and two conductive electrodes. The insulating antifuse layer may preferably be made of such materials such as amorphous silicon, $Si_3N_Y$ (for $0<Y\leq 4$), $SiO_X$ (for $0<X\leq 2$), $SiO_XN_Y$ (for $0<X\leq 2$ and $0<Y\leq 4/3$) as well as combinations thereof. When a programming voltage is applied to the electrodes of a conductor-to-conductor antifuse, the high electric field generated in the insulating antifuse layer leads to a high current density. The high current density causes local heating and destroys the dielectric insulating antifuse layer. Immediately afterwards, the conductors from the electrodes penetrate the insulating antifuse layer to form a conductive link or "core" between the two conductive lines or electrodes. Thus, the antifuse is switched from its off-state (non-conducting) to its on-state (conducting). Typically the change of resistance is from more than 1 gigaohm in the off-state to tens of ohms in the on-state for conductor-to-conductor antifuses.

After programming, the antifuse resistance may increase over time as a result of current flow through the conductive link, e.g., during read operations. When the link resistance becomes too high for the intended application, the antifuse is said to have been switched off. "Switch-off" often occurs when a read current comparable to the programming current is applied (S. Chiang, et al., supra). The phenomenon of switch-off greatly limits the operating conditions and design flexibility for conductor-to-conductor antifuses and poses a very serious reliability problem. Various mechanisms accounting for this phenomenon have been proposed, including electromigration (S. Chiang, et al., supra) and stress induced cracks (C. Hu, supra). The present invention provides a conductor-to-conductor antifuse structure which eliminates or greatly reduces the switch-off problem.

Regardless of the cause of the switch-off, it is reasonable to conclude that the radius of the conductive link or core should be larger than a certain critical value if the filament linking both conductive electrodes is to be stable. The radius of a molten core is related to the thermal conductivity of the conductor through the following equation:

$$r \propto I_p \sqrt{\left(\frac{\rho}{k}\right)} \propto \frac{I_p}{k} \qquad \text{EQ. 1}$$

where r is the radius, $I_p$ is the programming current, $\rho$ is the electrical resistivity of the electrode and k is the thermal conductivity of the electrode. The Wiedeman-Franz law states that the ratio of the thermal conductivity and electrical conductivity of different conductors is only a function of temperature, i.e., $\rho \propto 1/k$ (C. Kittel, Introduction to Solid State Physics, pp. 150–153). Resistance of the programmed antifuse is given by Eq. 2:

$$R \propto \frac{\rho}{r} \propto \frac{1}{I_p} \qquad \text{EQ. 2}$$

Overall, the core radius, r, is inversely proportional to the thermal conductivity of conductor, k, and is proportional to the programming current, $I_p$.

Accordingly. to ensure antifuse stability, we have concluded that one should choose conductors with lower thermal conductivity in preference to those of higher thermal conductivity.

In the past, conductors with high electrical conductivity were used as the electrode for the obvious reason of lower electrode resistance. However the Wiedeman-Franz law states that the electrical. and thermal conductivities of conductors are proportional to each other (See, e.g., Table 1 for the thermal and electrical conductivities of several conductors—excerpted from C. Kittel, Introduction to Solid State Physics, p. 111).

TABLE 1

| CONDUCTOR MATERIAL | THERMAL CONDUCTIVITY (W cm$^{-1}$ K$^{-1}$) | ELECTRICAL CONDUCTIVITY (10$^5$) (OHM-CM)$^{-1}$ | RATIO BETWEEN THERMAL AND ELECTRICAL CONDUCTIVITY |
|---|---|---|---|
| Mn | 0.08 | 0.072 | 1.11 |
| Ce | 0.11 | 0.12 | 0.92 |
| Gd | 0.11 | 0.07 | 1.57 |
| Tb | 0.11 | 0.09 | 1.22 |
| Pr | 0.12 | 0.15 | 0.80 |
| La | 0.14 | 0.13 | 1.08 |
| Sc | 0.16 | 0.21 | 0.76 |
| Nd | 0.16 | 0.17 | 0.94 |
| Y | 0.17 | 0.17 | 1.00 |
| Ti | 0.22 | 0.23 | 0.96 |
| Zr | 0.23 | 0.24 | 0.96 |
| Hf | 0.23 | 0.33 | 0.70 |
| TiN | 0.291 | 0.77 | 0.38 |
| WSi$_2$ | 0.393 | 0.26 | 1.51 |
| Ni | 0.91 | 1.43 | 0.64 |
| Co | 1.00 | 1.72 | 0.58 |
| Mo | 1.38 | 1.89 | 0.73 |
| W | 1.74 | 1.89 | 0.92 |
| Al | 2.37 | 2.74 | 0.86 |
| Au | 3.17 | 4.55 | 0.70 |

TABLE 1-continued

| CONDUCTOR MATERIAL | THERMAL CONDUCTIVITY (W cm$^{-1}$ K$^{-1}$) | ELECTRICAL CONDUCTIVITY (10$^5$ (OHM-CM)$^{-1}$) | RATIO BETWEEN THERMAL AND ELECTRICAL CONDUCTIVITY |
|---|---|---|---|
| Cu | 4.01 | 5.88 | 0.68 |
| Ag | 4.29 | 6.21 | 0.69 |

Prior art conductor-to-conductor antifuses have, in general, used conductors having relatively high thermal conductivities for electrodes and, as a result, had small conducting link radii and suffered from switch-off. The present invention utilizes conductors having low thermal conductivities for the electrodes. These conductors yield a larger link radius, thus the antifuse on-state resistance will not increase as a result of using these low electrical/thermal conductivity materials (See Eq. 2).

From the thermal conductivity information set forth in Table 1 we have determined that Mn, Sc, Y, Ti, Zr, Hf, TiN, WSi$_2$ and other electrical conductors with thermal conductivities below 0.4 W cm$^{-1}$ K$^{-1}$ are good materials for use in the electrode portion of conductor-to-conductor antifuses. Ti, for example, has a low thermal conductivity of 0.22 (W cm$^{-1}$ K$^{-1}$), while TiW, commonly used in prior art antifuses (see, e.g., U.S. Pat. No. 4,914,055) contains about 90% W where W has a relatively high thermal conductivity of 1.74 (W cm$^{-1}$ K$^{-1}$). This means that the use of Ti instead of TiW as the antifuse electrode will increase the radius of the conducting link by about six times, all else being equal.

Alternatively, the thermal resistance of the electrodes can be increased by reducing their thickness. Thus the use of thin electrodes is an alternative preferred embodiment of the present invention which is discussed below.

The cross-sectional view of a preferred embodiment of the antifuse 10 of the present invention is shown in FIG. 1. The materials used here are commonly used in VLSI fabrication. Thus, the antifuse of the present invention can be easily fabricated and incorporated into current VLSI technology.

Antifuse 10 is placed on a dielectric film 12 such as silicon dioxide or nitride and is preferably constructed in a vertical arrangement as shown in FIG. 1, i.e., dielectric film 12 at bottom, first electrode 14 over film 12 and second electrode 22 over first electrode 14. The bottom electrode 14 has a thickness of about 4000 Å of Ti metal, which preferably includes a barrier layer 16 of thickness preferably about 100 Å of w on the top of it. About 5000 Å of CVD oxide 18 is deposited and contact holes are made in a manner well known to those of ordinary skill in the art. Then a layer 20 of plasma enhanced CVD oxide ("PECVD oxide") as is well known to those of ordinary skill in the art is deposited. This is also referred to herein as the insulating antifuse layer.

The thickness of and material used for the antifuse layer should be as follows:

TABLE 2

| ANTIFUSE MATERIAL | PREFERRED THICKNESS RANGE |
|---|---|
| SiO$_X$, for $0 < X \leq 2$ | 20Å–250Å |
| Si$_3$N$_Y$ (for $0 < Y \leq 4$) | 20Å–250Å |
| SiO$_X$N$_Y$ (for $0 < X \leq 2$ and $0 < Y \leq 4/3$) | 20Å–250Å |

TABLE 2-continued

| ANTIFUSE MATERIAL | PREFERRED THICKNESS RANGE |
|---|---|
| Amorphous Silicon | 50Å–2000Å |

The range of thickness set forth in Table I were chosen to correspond to antifuse programming voltages in the range of 3 volts to about 20 Volts. Above about 20 Volts, the programming voltage becomes too high for most devices manufactured today for 5 volt operation and could result in chip damage. If programming voltage is below about 10 volts (twice the operating volts), the antifuses would program inadvertently. In the future, devices will be manufactured to operate at lower voltages such as 3.3 volts and 1.5 volts; the desirable range of programming voltages will decrease correspondingly. Presently preferred for layer 20 is a thickness of 120 Å±20 Å of SiO$_2$ which is programmable with a voltage of about 14.5 Volts. It should also be noted that combinations of the materials set forth in Table 2 may be constructed into either a single layer or a multi-layer antifuse layer of thickness determined by the desired programming voltage and operating voltage.

Top conductive electrode 22 is made of a thickness of about 4000 Å of Ti. Ti is preferred for use in the electrodes because of its low thermal conductivity. Because Ti is very thermally reactive and the processing temperatures for the manufacture of these antifuses range from about 200° C. to about 400° C. a barrier layer 16 of W is included in order to prevent the relatively thermally reactive Ti from being oxidized or nitridized. The Ti would otherwise react with the N$_2$O gas during the PECVD oxide deposition. This would result in rendering the breakdown voltage of the antifuse difficult to control or predict. Other electrode materials that are thermally reactive will also benefit from the inclusion of such a barrier layer. Table 3 sets forth the presently preferred materials and thicknesses for the barrier layer.

TABLE 3

| MATERIAL | THICKNESS |
|---|---|
| W | 50Å–300Å |
| TiW | 50Å–300Å |
| TiN | 50Å–2000Å |

The materials used for the barrier layer and those shown above are relatively chemically inert so that they will not react with the Ti or other electrode material, furthermore, they should not react with the processing materials such as the etch gas used to etch down the antifuse layer. The thicknesses are chosen in the range of 50 Å–300 Å for W and TiW because above 300 Å these materials begin to act like regular high thermal conductivity antifuse electrodes and exhibit switch-off. In the range of 50 Å–300 Å there is enough of the material present to provide a useful barrier layer, yet the thickness is not so great that the benefits of the low thermal conductivity electrodes are lost. The thickness range of 50 Å–2000 Å for TiN is different on the high side because TiN is a conductor with low thermal conductivity and thicknesses of up to 2000 Å of TiN do not cause the phenomenon of switch-off to appear in the antifuse.

In a presently preferred embodiment of the present invention, a 100 Å thick layer of W is used.

The addition of barrier layer 16 on the top of Ti bottom electrode 14 also provides an etch stop between the Ti and oxide layer 18 since HF, used to etch the oxide layer, also attacks Ti.

A similar barrier layer 21 is preferably inserted between the top Ti electrode 22 and the PECVD oxide layer 20 to improve stability. The considerations governing the material choice and thickness of this barrier layer 21 are much the same as before for barrier layer 16, except that this layer is less critical and may even be omitted since the conditions that are present at the interface of antifuse layer 20 and electrode layer 14 (for example, the $N_2O$ gas used in PECVD deposition of $SiO_2$) are not all present at the interface of antifuse layer 20 and electrode layer 22, the top electrode.

Figure 2:
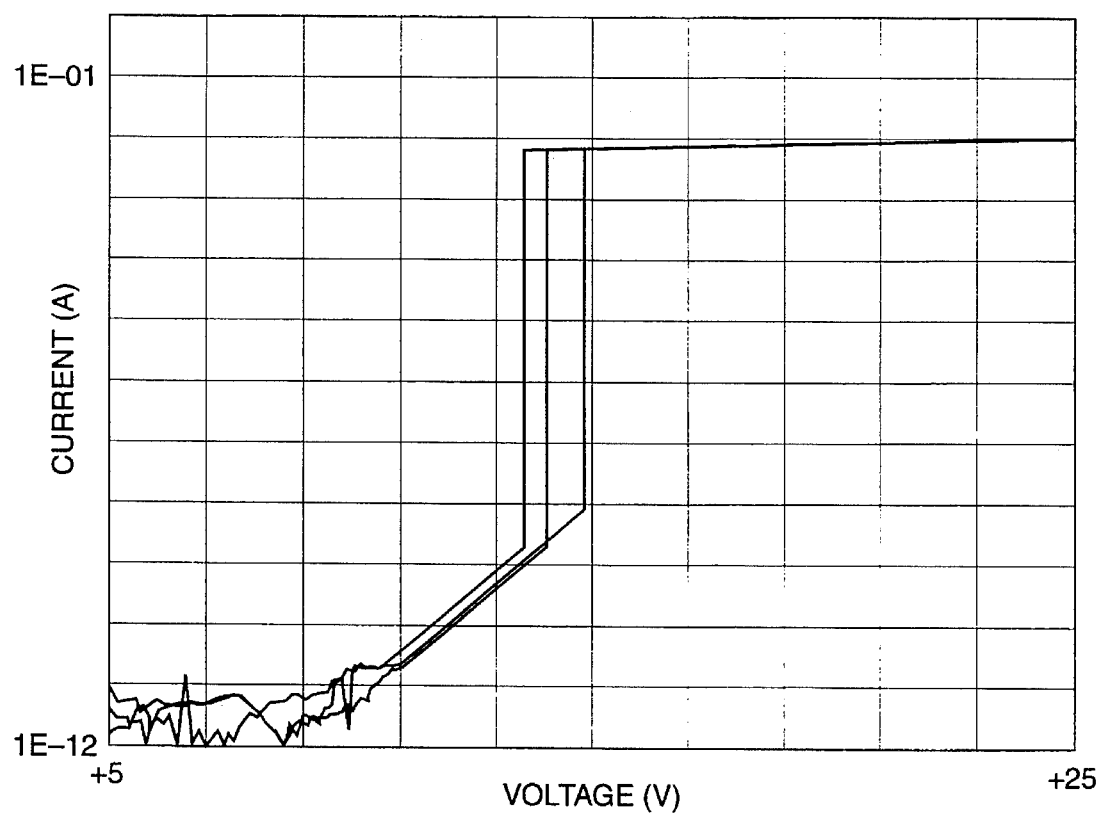
FIG. 2 is a plot of the current through three separate antifuses made according to the first preferred embodiment of the present invention against positive voltage applied to the top electrode of the antifuse.
Figure 3:
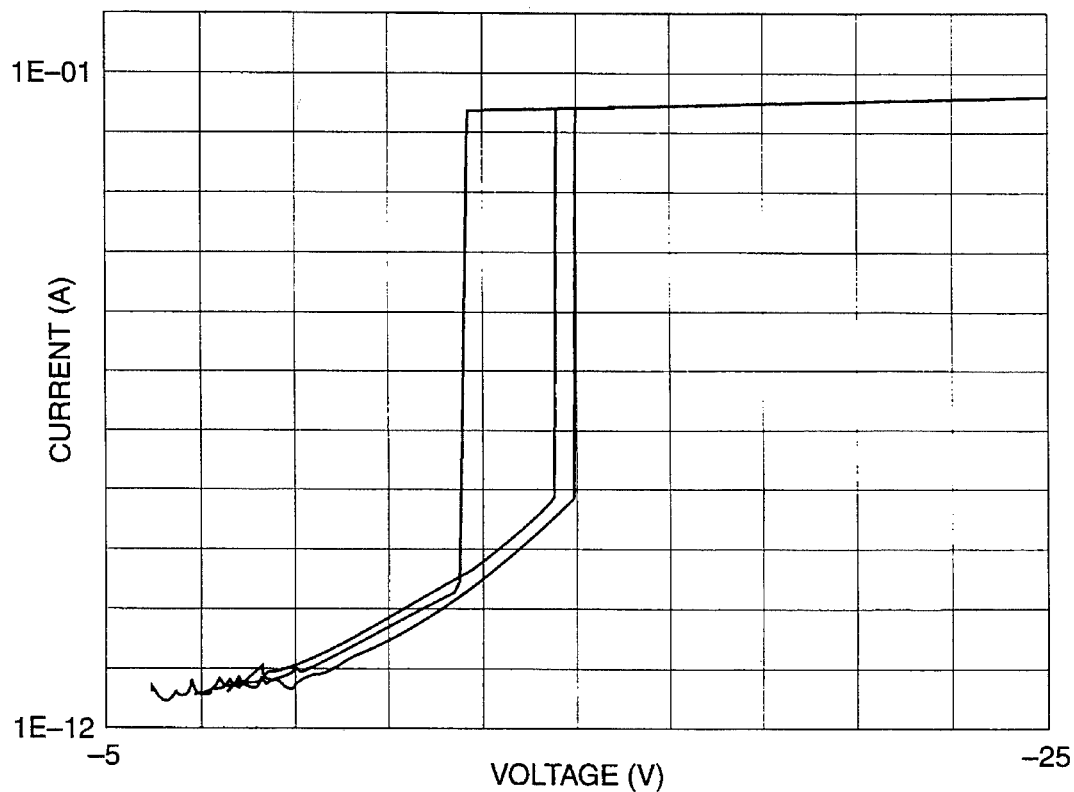
FIG. 3 is a plot of the current through three separate antifuses made according to the first preferred embodiment of the present invention against negative voltage applied to the top electrode of the antifuse.
Figure 4:
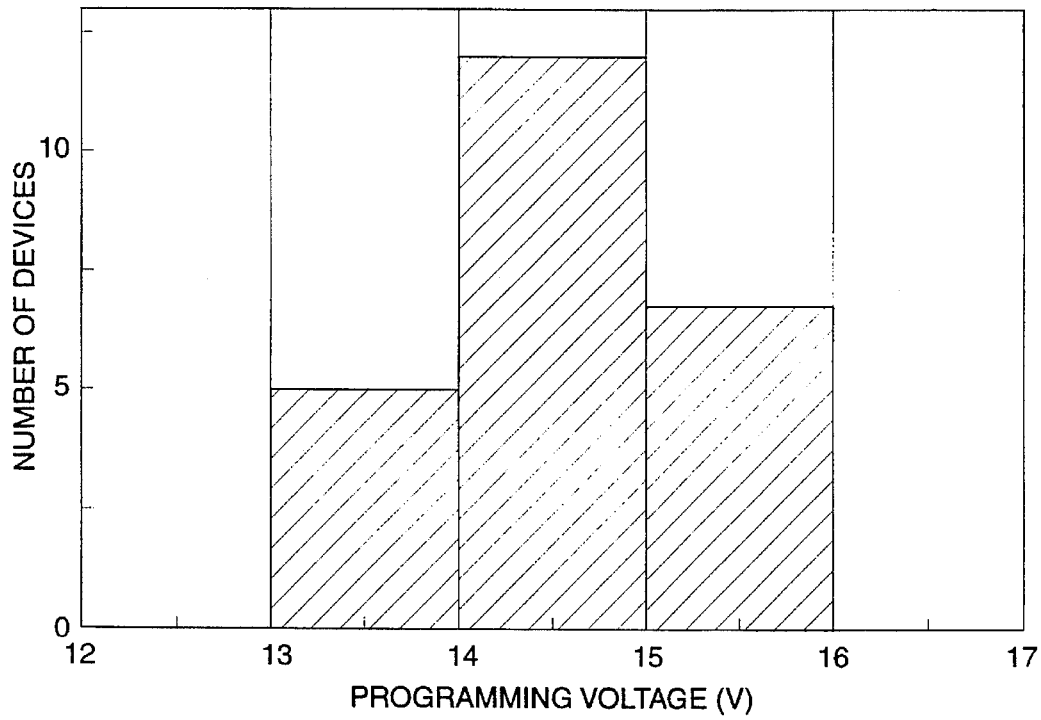
FIG. 4 is a histogram of programming voltage (positive voltage applied to the top electrode of the antifuse) of several antifuses made according to the first preferred embodiment of the present invention.
Figure 5:
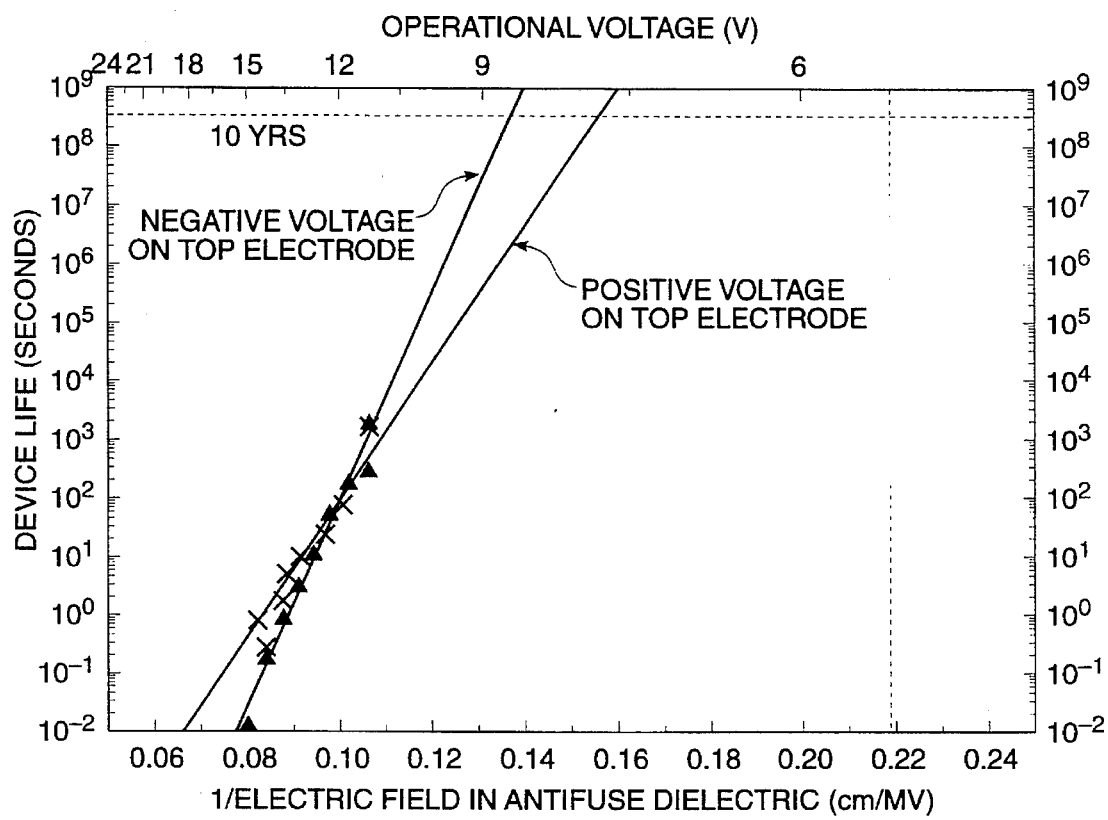
FIG. 5 is a log-linear plot of device life vs. operating voltage for several antifuses made according to the first preferred embodiment of the present invention.

The breakdown voltage (programming voltage) of the antifuse described above is around 14.5 volts with a fluctuation of 0.6 volts for $2\times2$ $\mu m^2$ antifuses. FIG. 2 is a plot of the current through three separate antifuses made according to the first preferred embodiment of the present invention against positive voltage applied to the top electrode of the antifuse. FIG. 3 is a plot of the current through three separate antifuses made according to the first preferred embodiment of the present invention against negative voltage applied to the top electrode of the antifuse. The leakage current at 5.5 volts is less than $0.01 pA/\mu m^2$ for both stress polarities. FIG. 4 is a histogram of programming voltage (positive voltage applied to the top electrode of the antifuse) of several antifuses made according to the first preferred embodiment of the present invention. FIG. 5 is a log-linear plot of device life vs. operating voltage for several antifuses made according to the first preferred embodiment of the present invention. From this one can predict, as is well known to those of ordinary skill in the art, that the lifetime of the unprogrammed antifuses well exceeds 10 years at 5.5 volts for both polarities. Similarly, the programming time of the antifuse described above is less than 0.1 sec at an 18 volt programming voltage. This is as good or better than other known conductor-to-conductor antifuses (S. Chiang, et al., supra).

Figure 6:
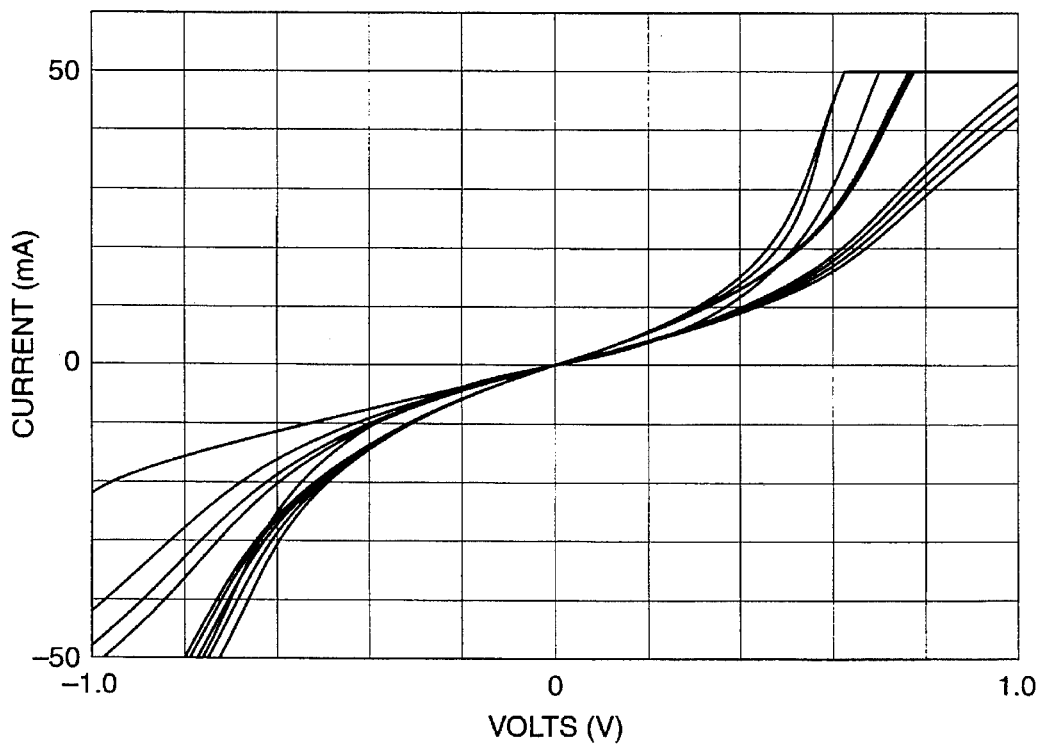
FIG. 6 is a plot of the I-V characteristics of several programmed antifuses made according to the first preferred embodiment of the present invention. Here the antifuses were programmed at about 10 mA and their characteristics are shown in the range of +50 mA to −50 mA.

FIG. 6 is a plot of the I-V characteristics of several programmed antifuses made according to the first preferred embodiment of the present invention. Here the antifuses were programmed at about 10 mA and their characteristics are shown in the range of +50 mA to −50 mA. In antifuses manufactured as set forth above, after being programmed at 10 mA, no switch-off is observed at read currents of up to 50 mA of either polarity.

Figure 7:
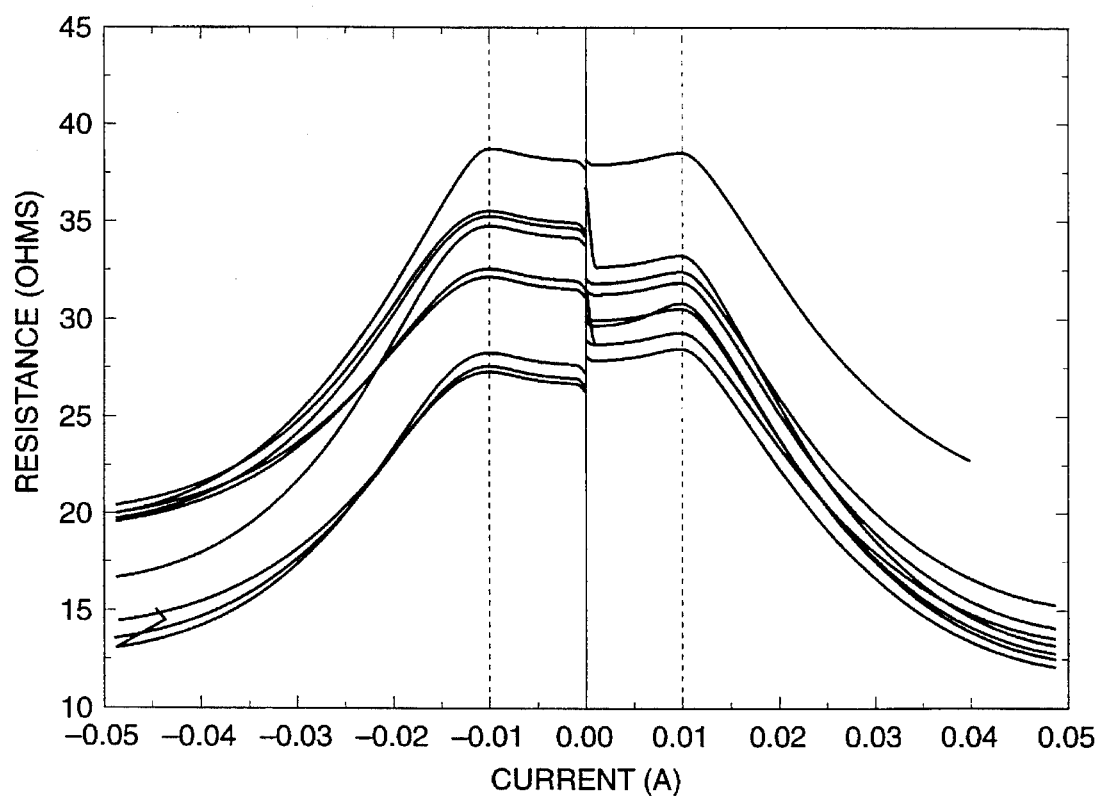
FIG. 7 is a plot of the resistance of the programmed antifuses vs read current for several programmed antifuses made according to the first preferred embodiment of the present invention. As can be seen, the antifuses appear to improve (have lower resistance) with use.

FIG. 7 is a plot of the resistance of the programmed antifuses vs. read current for several programmed antifuses made according to the first preferred embodiment of the present invention. As can be seen, the antifuses appear to improve (have lower resistance) with use at programming currents up to five times their programming current. The stability exhibited by these antifuses is several times better than that of other conductor-to-conductor antifuses. This is in large part due to the low thermal conductivity of Ti. Under the same programming conditions, the core radius of the antifuse is six times larger than that of antifuses using W as electrodes which has been used as an electrode material for antifuses. Hence, the conducting link of the new antifuse of the present invention is far more stable than the antifuses made of prior art electrode materials, e.g., W and TiW. The on-state resistance of the new antifuse is very low at around 20 ohms. Up to the programming current, the on-state resistance is a constant or rises a little bit with read current. When the read current is larger than the programming current, the on-state resistance decreases with the increasing read current, following a known model (E. Hamdy, et al., "Dielectric Based Antifuse for Logic and Memory ICs", 1988 I.E.D.M., pp. 786–789). The on-state resistance is about one tenth that of N+/ONO/Poly and somewhat less than other conductor-to-conductor antifuses. This confirms that even though Ti, as an example of a low thermal conductivity electrically conductive material, has six times higher electrical resistivity than W or Mo (Table 1), antifuses using Ti as the electrode do not have higher on-state resistance. The low on-state resistance is attributed to the large radius of the conductive core and the low resistivity of Ti silicide inside the core. Of all the known silicides, Ti silicide is the only one whose resistivity is smaller than its elemental counterpart (Murarka, Silicide on VLSI application, pp. 30–31). Hence, Ti is particularly well suited to this application.

Other low thermal conductivity electrically conductive materials such as Mn, Sc, Y, Zr, Hf, TiN, $WSi_2$ and other electrical conductors with thermal conductivities below 0.4 $W\ cm^{-1}\ K^{-1}$ may be used as the bottom/top electrodes instead of Ti in accordance with the present invention. Metal alloys, conducting metal oxides and metal nitrides with low thermal conductivity, such as $TiN_X$ (for $0<X\leq1$), $SnO_X$ (for $0<X\leq1$), and $InO_X$ (for $0.50\leq X\leq1$) can also be used for the low thermal conductivity electrodes. Preferably such antifuses should also include a bottom and, optionally, a top barrier layer of a material such as W, TiW or TiN as set forth above between these materials and the antifuse dielectric material. Thermal conduction will take place through both the top and the bottom electrode of an antifuse according to the present invention, therefore, one aspect of this invention is that low thermal conductivity materials should preferably be used for both the top and bottom electrodes.

Figure 8:
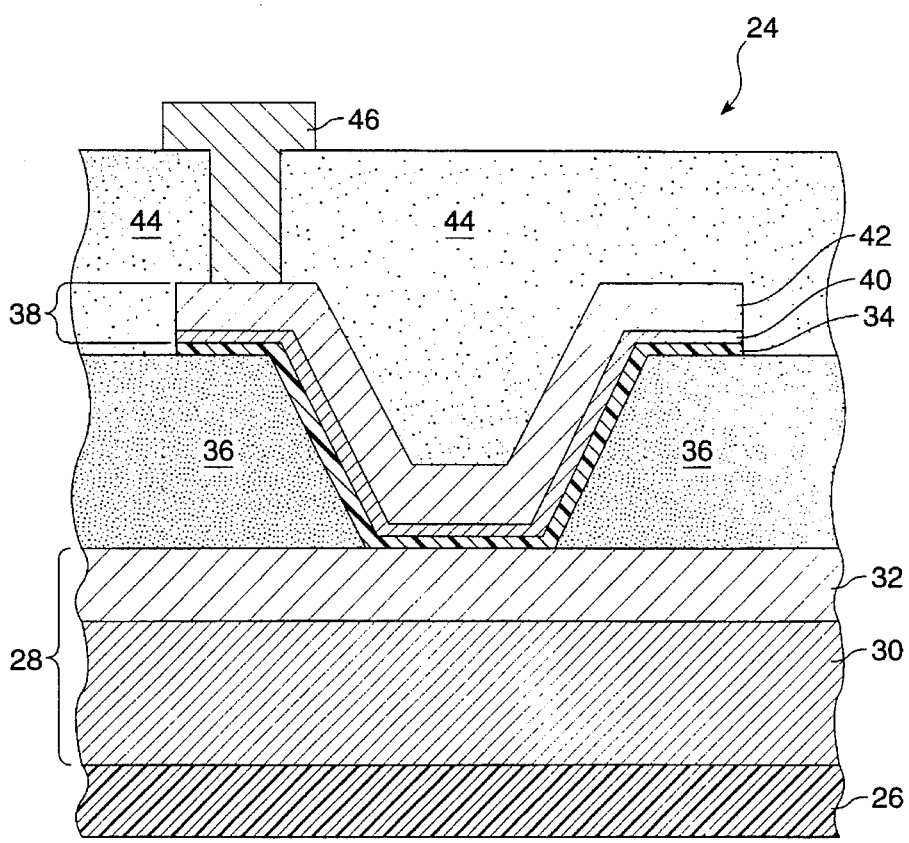
FIG. 8 is a drawing of a second preferred embodiment of the antifuse of the present invention.

Turning now to FIG. 8, a hybrid antifuse structure 24 utilizing both high and low electrical conductivity materials for the electrodes is shown. The advantage of this structure is that the high electrical conductivity material reduces the interconnect resistance while the low electrical and low thermal conductivity material in contact with the dielectric antifuse layer achieve the prevention of switch-off. Here, a substrate 26, preferably of silicon dioxide or a similar material, is provided in the base of the antifuse 24. A lower electrode 28 comprises a first layer of a high electrical conductivity conductor 30 such as Al, Al/TiW, Al/TiN, or combinations thereof as known to those of ordinary skill in the art, and a second layer of a low electrical conductivity/low thermal conductivity conductor 32 such as Mn, Sc, Y, Ti, Zr, Hf, TiN, $WSi_2$ and other electrical conductors with thermal conductivities below 0.4 $W\ cm^{-1}\ K^{-1}$ including $TiN_X$ (for $0<X\leq1$), $SnO_X$ (for $0<X\leq1$), and $InO_X$ (for $0.50\leq X\leq1$). Here the low thermal conductivity material should have a sufficient thickness (at least 300 Å) in contact with the insulating antifuse layer 34. A field oxide layer 36 is provided as before. Upper electrode 38 comprises a first layer of a low thermal conductivity/low electrical conductivity conductor 40 and a second layer of a high electrical conductivity conductor 42. An isolation layer 44 and top contact 46 are provided as are known to those of ordinary skill in the art.

Figure 9:
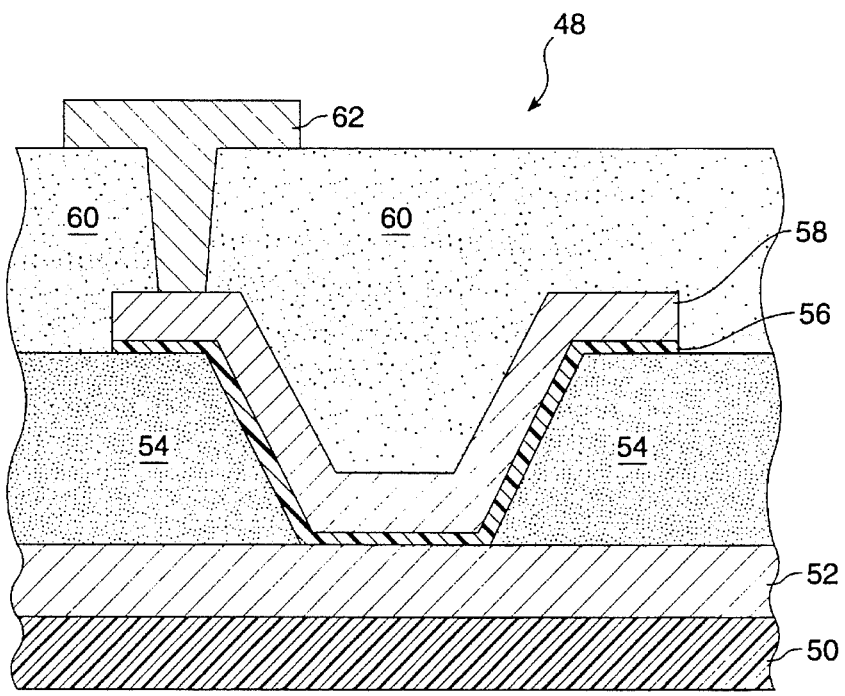
FIG. 9 is a drawing of a third preferred embodiment of the antifuse of the present invention.

Another preferred embodiment of the present invention is illustrated at FIG. 9. As shown in FIG. 9, an antifuse structure 48 comprises a substrate 50 and a lower electrode 52 which is fabricated of a layer of an electrical conductor having a thickness of no more than 1000 Å. Reducing the electrode thickness has a similar effect to reducing the thermal conductivity of the electrode material in that it also results in an increase in the radius of the conducting link and thus improved switch-off stability. The electrodes are preferably fabricated of any chemically compatible conductor in this application. A field oxide layer 54 is provided as before.

The insulating antifuse layer 56 is in contact with first (bottom) electrode 52 and top electrode 58. Since thermal conduction occurs through both top and bottom electrodes, both electrodes should be designed with low thermal conductivity in mind, e.g., both should have a thickness of no more than 1000 Å, thus top electrode 58 is also a conductor having a thickness of no more that 1000 Å. An isolation layer 60 and top contact 62 are provided, as before.

In this application, it is preferred to have the antifuse layer take on the characteristics as set forth in Table 2. It should also be noted that combinations of the materials set forth in Table 2 may be constructed into either a single layer or a multi-layer antifuse layer of thickness determined by the desired programming voltage and operating voltage.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An antifuse disposed on an integrated circuit, said antifuse comprising:

a first conductive electrode having a first thickness and a substantially constant thermal conductivity throughout said first thickness;

a second conductive electrode having a second thickness and a substantially constant thermal conductivity throughout said second thickness;

an insulating antifuse layer located between said first conductive electrode and said second conductive electrode, said insulating antifuse layer comprising materials selected from the group consisting of $SiO_x$, for $0<x\leq2$, $Si_3N_Y$ (for $0<Y\leq4$), $SiO_XN_Y$ (for $0<X\leq2$ and $0<Y\leq4/3$) and Amorphous Silicon, said antifuse layer having a thickness much less than either said first thickness or said second thickness, and a first barrier layer disposed between said first conductive electrode and said insulating antifuse layer, wherein said first conductive electrode and said second conductive electrode consist substantially of electrically conductive materials with thermal conductivities below 0.4 W cm$^{-1}$ K$^{-1}$.

2. An antifuse disposed on an integrated circuit, said antifuse comprising:

a first conductive electrode having a first thickness and a substantially constant thermal conductivity throughout said first thickness;

a second conductive electrode having second thickness and a substantially constant thermal conductivity throughout said second thickness;

an insulating antifuse layer located between said first conductive electrode and said second conductive electrode, said insulating antifuse layer comprising materials selected from the group consisting of $SiO_x$, for $0<x\leq2$, $Si_3N_Y$ (for $0<Y\leq4$) $SiO_XN_Y$ (for $0<X\leq2$ and $0<Y\leq4/3$) and Amorphous Silicon, said antifuse layer having a thickness much less than either said first thickness or said second thickness, and a barrier layer disposed between said first conductive electrode and said insulating antifuse layer, said barrier layer comprising materials selected from the group consisting of W, TiW and TiN, wherein said first conductive electrode and said second conductive electrode consist substantially of electrically conductive materials with thermal conductivities below 0.4 W cm$^{-1}$ K$^{-1}$.

3. An antifuse disposed on an integrated circuit, said antifuse comprising:

a first conductive electrode consisting substantially of Ti vertically oriented over an insulating film of the integrated circuit, said first electrode having a first thickness and a substantially constant thermal conductivity throughout said first thickness;

a second conductive electrode consisting substantially of Ti vertically oriented over said first electrode, said second electrode having a second thickness and a substantially constant thermal conductivity throughout said second thickness;

an insulating antifuse layer disposed between said first conductive electrode and said second conductive electrode, said insulating antifuse layer comprising $SiO_x$, for $0<x\leq2$, and having a thickness in the range of about 20 Å to about 250 Å, said antifuse layer having a thickness much less than either said first thickness or said second thickness; and a first barrier layer disposed between said first conductive electrode and said insulating antifuse layer, said barrier layer fabricated from a layer of W of thickness in the range of about 50 Å–300 Å.

4. An antifuse according to claim 3 further comprising a second barrier layer disposed between said second conductive electrode and said insulating antifuse layer, said barrier layer fabricated from a layer of W of thickness in the range of about 50 Å–300 Å.

\* \* \* \* \*

UNITED STATES PATENT AND TRADEMARK OFFICE
CERTIFICATE OF CORRECTION

PATENT NO. : 5,485,031
DATED : January 16, 1996
INVENTOR(S) : Guobiao Zhang, Chenming Hu; Steve S. Chiang It is certified that error appears in the above-indentified patent and that said Letters Patent is hereby corrected as shown below:

Column 2, line 35, after "resistance" insert --.--.

On Column 4, line 30, replace "Accordingly." with --Accordingly,--.

On Column 1, line 63 after "Arrays"" insert --,--.

On Column 3, line 67 after "and" delete ".".

On Column 4, line 37 after "electrical" delete ".".

On Column 5, line 51 replace "w" with --W--.

On Column 10, line 1, after "having" insert --a--.

Signed and Sealed this

Twelfth Day of November, 1996

Attest:

BRUCE LEHMAN

Attesting Officer    Commissioner of Patents and Trademarks